United States Patent
Chiang et al.

(10) Patent No.: US 7,911,031 B2
(45) Date of Patent: Mar. 22, 2011

(54) VOLTAGE-CONTROLLED SEMICONDUCTOR STRUCTURE, RESISTOR, AND MANUFACTURING PROCESSES THEREOF

(75) Inventors: Chiu-Chih Chiang, Hsinchu (TW); Chih-Feng Huang, Zhubei (TW)

(73) Assignee: System General Corporation, Taipei (TW)

( * ) Notice: Subject to any disclaimer, the term of this patent is extended or adjusted under 35 U.S.C. 154(b) by 0 days.

(21) Appl. No.: 11/507,293

(22) Filed: Aug. 21, 2006

(65) Prior Publication Data
US 2008/0042241 A1 Feb. 21, 2008

(51) Int. Cl.
*H01L 29/8605* (2006.01)
(52) U.S. Cl. .................... 257/537; 257/E29.326
(58) Field of Classification Search ............. 257/245, 257/536, 537, 572, E27.037, E27.043, E29.326
See application file for complete search history.

(56) References Cited

U.S. PATENT DOCUMENTS

| | | | | |
|---|---|---|---|---|
| 5,260,595 A | * | 11/1993 | Hayama | 257/379 |
| 6,624,737 B2 | * | 9/2003 | Chang et al. | 338/9 |
| 2005/0062586 A1 | * | 3/2005 | Erickson et al. | 338/309 |
| 2005/0121746 A1 | * | 6/2005 | Erickson et al. | 257/536 |
| 2006/0125015 A1 | | 6/2006 | Woo | |

\* cited by examiner

*Primary Examiner* — Benjamin P Sandvik
*Assistant Examiner* — W. Wendy Kuo

(57) ABSTRACT

Voltage-controlled semiconductor structures, voltage-controlled resistors, and manufacturing processes are provided. The semiconductor structure comprises a substrate, a first doped well, and a second doped well. The substrate is doped with a first type of ions. The first doped well is with a second type of ions and is formed in the substrate. The second doped well is with the second type of ions and is formed in the substrate. The first type of ions and the second type of ions are complementary. A resistor is formed between the first doped well and the second doped well. A resistivity of the resistor is controlled by a differential voltage. A resistivity of the resistor relates to a first depth of the first doped well, a second depth of the second doped well, and a distance between the first doped well and the second doped well. The resistivity of the resistor is higher than that of a well resistor formed in a single doped well with the second type of ions.

1 Claim, 3 Drawing Sheets

VOLTAGE-CONTROLLED SEMICONDUCTOR STRUCTURE, RESISTOR, AND MANUFACTURING PROCESSES THEREOF

CROSS-REFERENCES TO RELATED APPLICATIONS

Not applicable.

BACKGROUND OF THE INVENTION

1. Field of the Invention

The present invention relates to a voltage-controlled semiconductor structure, resistor, and manufacturing processes thereof; more particularly, relates to a voltage-controlled semiconductor structure and resistor with high resistivities and manufacturing process thereof.

2. Descriptions of the Related Art

Resistors with high resistivities are widely used in many electrical applications. Currently, there are two main approaches to manufacture resistors with high resistivities. The first approach is to use non-doped polysilicon as the resistor. The highest resistivity of this type of resistors is about 1K ohm/sq. The advantage of this approach is that sizes of resultant resistors are small. However, it has the drawbacks of using additional masks and processes, which costs a lot.

The second approach is to manufacture a resistor with a lightly doped well. The highest resistivity of this type of resistors is about 10K ohm/sq. Since a well with higher doping concentration presents lower resistivity, the resistivity of a resistor can be controlled by using different ion concentrations of the well. However, sizes of resultant resistors are still large.

Both of the two approaches have another common drawback, that is, both resistors cannot adjust the resistivity once the resistors are manufactured.

According to the aforementioned description, it is obvious that both current approaches have critical problems and limit the application of resistor in circuitry. Thus, how to overcome the two problems simultaneously is investigated in this work.

SUMMARY OF THE INVENTION

An object of this invention is to provide a semiconductor structure. The semiconductor structure comprises a substrate, a first doped well, and a second doped well. The substrate is doped with a first type of ions. The first doped well is with a second type of ions and is formed in the substrate. The second doped well is with the second type of ions and is formed in the substrate. The first type of ions and the second type of ions are complementary. A resistor is formed between the first doped well and the second doped well. A resistivity of the resistor relates to a first depth of the first doped well, a second depth of the second doped well, and a distance between the first doped well and the second doped well. The resistivity of the resistor is higher than that of a well resistor formed in a single doped well with the second type of ions.

Another object of this invention is to provide a voltage-controlled resistor. The voltage-controlled resistor comprises two ends respectively connected to two doped wells formed in a substrate. The substrate is with a first type of ions. The doped wells are with a complementary second type of ions. The two connecting ends connect to a high voltage and a low voltage respectively. The doped wells are split.

Another object of this invention is to provide a voltage-controlled resistor. The voltage-controlled resistor comprises two ends respectively connected to two doped wells formed in a substrate. The substrate is with a first type of ions. The doped wells are with a complementary second type of ions. The two connecting ends connect to a high voltage and a low voltage respectively. The doped wells are quasi-linked.

A further object of this invention is to provide a semiconductor process for forming a semiconductor resistor with high resistivity. The method comprises the steps of forming two deep wells in a substrate, wherein depletion regions respectively formed by the two doped wells and the substrate are connected, doping concentrations of the deep wells and the substrate are complementary; forming an oxide layer; forming a heavy-doped region in each of the deep wells; and forming two conducting ends connected the heavy-doped regions with conductive material.

Yet a further object of this invention is to provide a semiconductor structure. The semiconductor structure comprises a substrate and a well with a gap formed in the substrate. Ion concentrations of the substrate and the well are complementary. A depletion region between the well and the substrate is varied to control resistivity of the semiconductor structure according to a differential voltage applied to the well.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

The present invention relates to voltage-controlled semiconductor structure and resistor with high resistivities and manufacturing processes thereof. To be more specific, the present invention provides approaches to generate resistors whose sizes are small without extra processes and costs. In addition, resistivity of resistors generated by the present invention can be controlled by applying differential voltage on the resistors.

Figure 1:
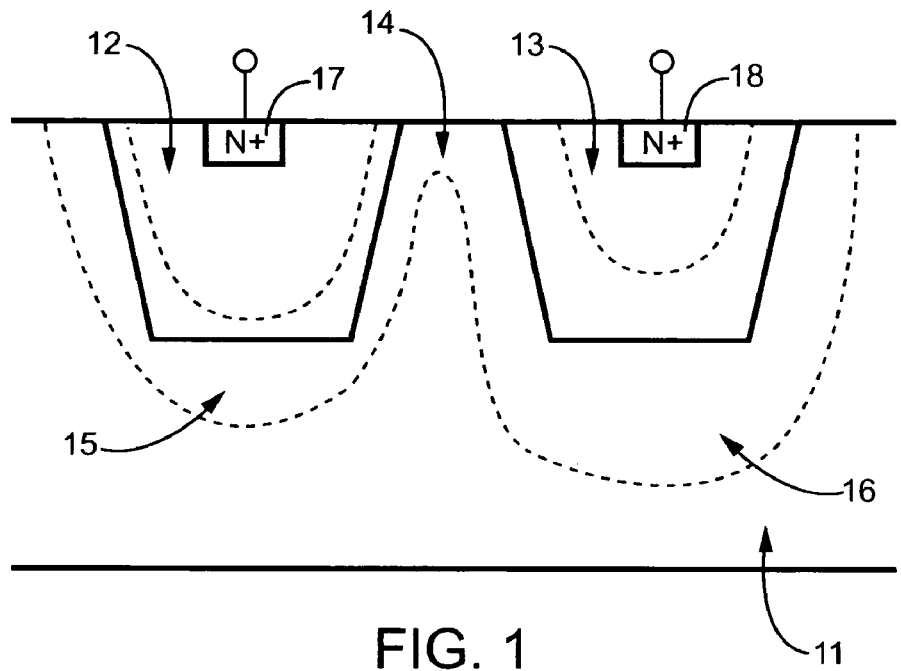
FIG. 1 illustrates a first embodiment of the present invention.

FIG. 1 illustrates a first embodiment of the present invention, which is a voltage-controlled resistor. The resistor comprises a P-substrate 11 and two deep N-wells 12 and 13. There are two N+ regions 17 and 18 formed in the two deep N-wells 12 and 13 respectively as terminals of the resistor. The two deep N-wells 12 and 13 are formed in the P-substrate 11 and are split. An equivalent resistor 14 is formed between the two deep N-wells 12 and 13. The depletion region 15 is formed by the first deep N-well 12 and the P-substrate 11, and boundaries of the depletion region 15 are presented by two dashed lines. Similarly, the depletion region 16 is formed by the second deep N-well 13 and the P-substrate 11, and boundaries of the depletion region 15 are presented by two dashed lines. The two depletion regions 15 and 16 are connected.

A differential voltage is applied on the resistor via the N+ regions 17 and 18, causing a reverse bias between the P-type doped region, such as the P-substrate 11, and the N-type doped region, such as the deep N-wells 12 and 13. The reverse bias affects the depletion region along with junction of the P-type doped region and the N-type doped region, and the differential thus controls electrical characters of the depletion region. In the first embodiment, a resistivity of the resistor is mainly determined by a resistivity of the equivalent resistor 14 and substantially decreases after the differential voltage applied at the N+ regions 17 and 18 increases and results in punch-through between the doped wells. When punch-through occurs, ions flowing through the equivalent resistor 14 dramatically increase, which results in decrease of the resistivity. The mechanism is controlled by the applied differential voltage, which achieves a voltage-controlled resistor. In this embodiment, the range of an ion concentration of each of the doped wells is from 1E12 to 5E13 per square centimeter and the range of a depth of each of the deep wells is from 2 to 10 μm.

The geometries and ion concentrations of each region affects characters of the depletion region, thus the resistivity of the equivalent resistor 14 relates to a first depth of the deep N-well 12, a second depth of the deep N-well 13, and a distance between the two deep N-wells 12 and 13. The distance between the first deep N-well 12 and the second deep N-well 13 is configured according to a first ion concentration of the first deep N-well 12, a second ion concentration of the second deep N-well 13, and a third ion concentration of the substrate 11. The resistivity of the resistor 14 is higher than that of a conventional well resistor formed in a single doped well with the second type of ions.

The P-substrate 11 and the two deep N-wells 12 and 13 can be replaced by an N-substrate and two deep P-wells, so that the replacement forms a complementary structure of the first embodiment and still works. In addition, voltages applied to the complementary structure must be reversed bias voltages between the P-type doped and N-type doped regions in substantial resistor region.

Figure 2:
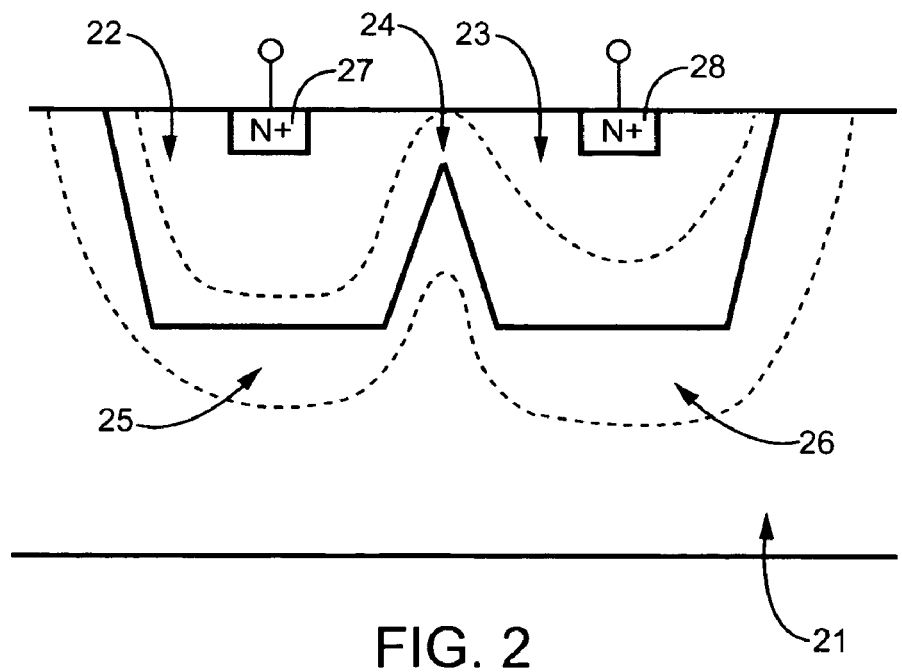
FIG. 2 illustrates a second embodiment of the present invention.

FIG. 2 illustrates a second embodiment of the present invention, which is a voltage-controlled resistor. The resistor comprises a P-substrate 21 and two deep N-wells 22 and 23. There are two N+ regions 27 and 28 formed in the two deep N-wells 22 and 23 respectively as terminals of the resistor. The difference between this embodiment and the first embodiment is that the two deep N-wells 22 and 23 are quasi-linked but not split. An equivalent resistor 24 is formed between the two deep N-wells 22 and 23. The connection between the two deep N-wells 22 and 23 is interrupted when a differential voltage applied on the resistor increases.

A differential voltage is applied on the resistor via the N+ regions 27 and 28, causing a reverse bias between the P-substrate 21, and the N-wells 22 and 23. The reverse bias affects the depletion region along with junction of the P-type doped region and the N-type doped region, and the differential thus controls electrical characters of the depletion region. In the second embodiment, a resistivity of the resistor is mainly determined by a resistivity of the equivalent resistor 24 and substantially increases after the differential voltage applied at the N+ regions 27 and 28 increases and results in pinch-off around the quasi-link region. When pinch-off occurs, connection of the N-wells 27 and 28 around the quasi-link region is interrupted by the depletion regions 25 and 26, and ions flowing through the equivalent resistor 24 dramatically decrease, which results in increase of the resistivity. The mechanism is controlled by the applied differential voltage, which achieves a voltage-controlled resistor. In this embodiment, the range of an ion concentration of each of the doped wells is from 1E12 to 5E13 per square centimeter and the range of a depth of each of the deep wells is from 2 to 10 μm.

The geometries and ion concentrations of each region affect characters of the depletion region, thus the distance between the first deep N-well 22 and the second deep N-well 23 is also configured according to a first ion concentration of the first deep N-well 22, a second ion concentration of the second deep N-well 23, and a third ion concentration of the substrate 21. The resistivity of the resistor 24 relates to a first depth of the deep N-well 22, a second depth of the deep N-well 23, and a distance between the two deep N-wells 22 and 23. The resistivity of the resistor 24 is higher than that of a conventional well resistor formed in a single doped well with the second type of ions.

The P-substrate 21 and the two deep N-wells 27 and 28 in this embodiment can be replaced by an N-substrate and two deep P-wells, so that the replacement forms a complementary structure of the first embodiment and still works. In addition, voltages applied to the complementary structure must be reversed bias voltages between the P-type doped and N-type doped regions in substantial resistor region.

A third embodiment is a semiconductor structure with substantially the same equivalent resistor region as the first and the second embodiments. The third embodiment comprises a substrate and a deep well with a gap formed in the substrate, which means that the third embodiment applies a single manufacturing process of the deep well with a gap to achieve the punch-through structure of the first embodiment or pinch-off structure of the second embodiment. Ion types of the substrate and the deep well are complementary. A depletion region between the deep well and the substrate is varied to control resistivity of the semiconductor structure according to a voltage applied to the deep well. In both cases of forming the punch-through and pinch-off structures, the deep well is formed in a single mask process, which means the manufacturing processes only need one mask for forming the deep well.

Figure 3:
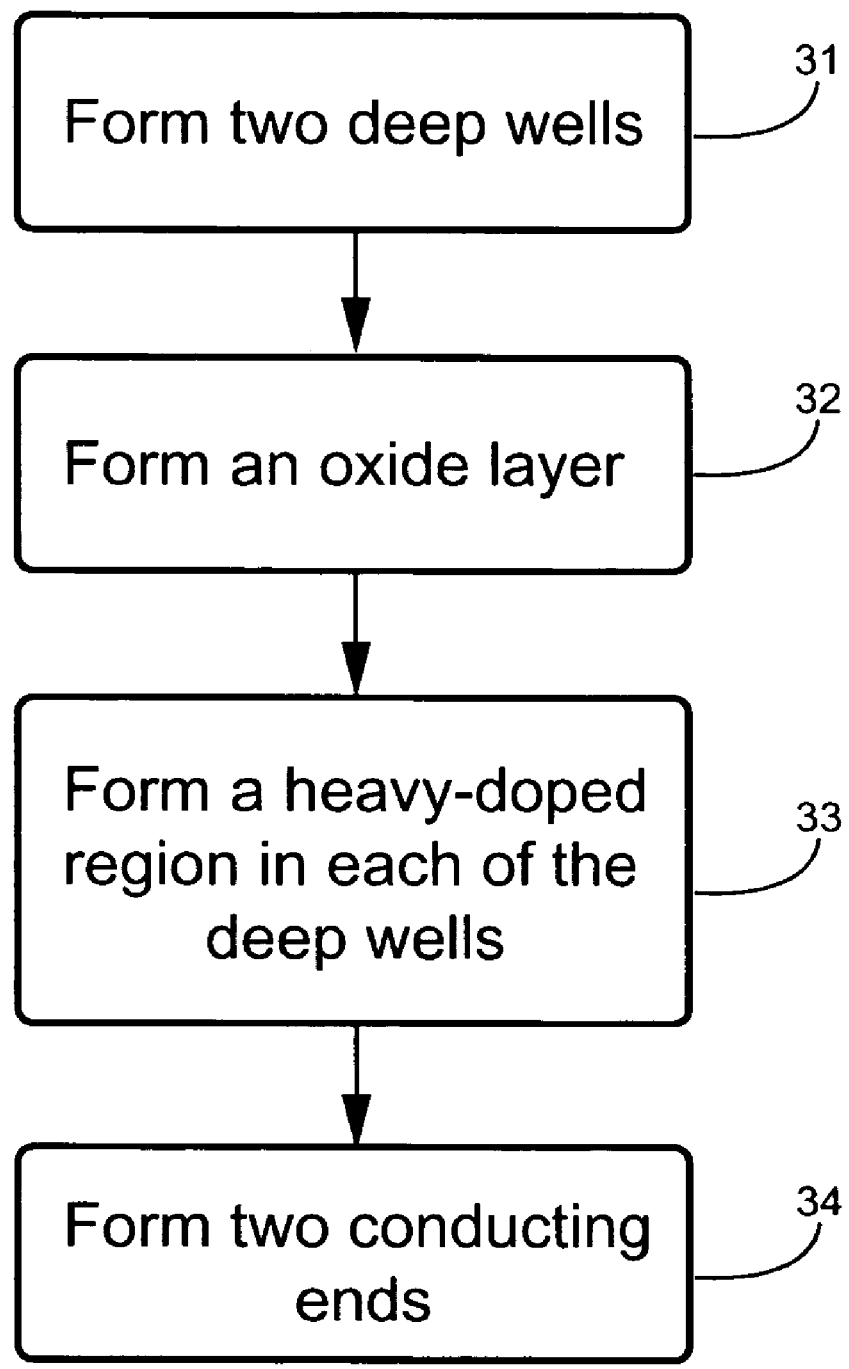
FIG. 3 illustrates a fourth embodiment of the present invention.

A fourth embodiment of the present invention is a semiconductor process for forming a semiconductor resistor with high resistivity. The corresponding flowchart is illustrated in FIG. 3. First, step 31 is executed to form two deep wells in a substrate with complementary ions, wherein depletion regions respectively formed by the two doped wells and the substrate are connected. The step 31 further comprises thermal driving for 6 to 12 hours under 1000 to 1200 degrees of Celsius. Then, step 32 is executed to form an oxide layer. Step 33 is executed to form a heavy-doped region in each of the deep wells. Finally, step 34 is executed to form two conducting ends connected the heavy-doped regions with conductive material.

Alternatively, the heavy-doped region may be formed before the deep well being formed. That is, step 31 can be executed posterior to step 33. Moreover, the sequence of the aforementioned steps is for the purpose of an example. The sequence is not intended to be a limitation of the present invention.

Figure 4:
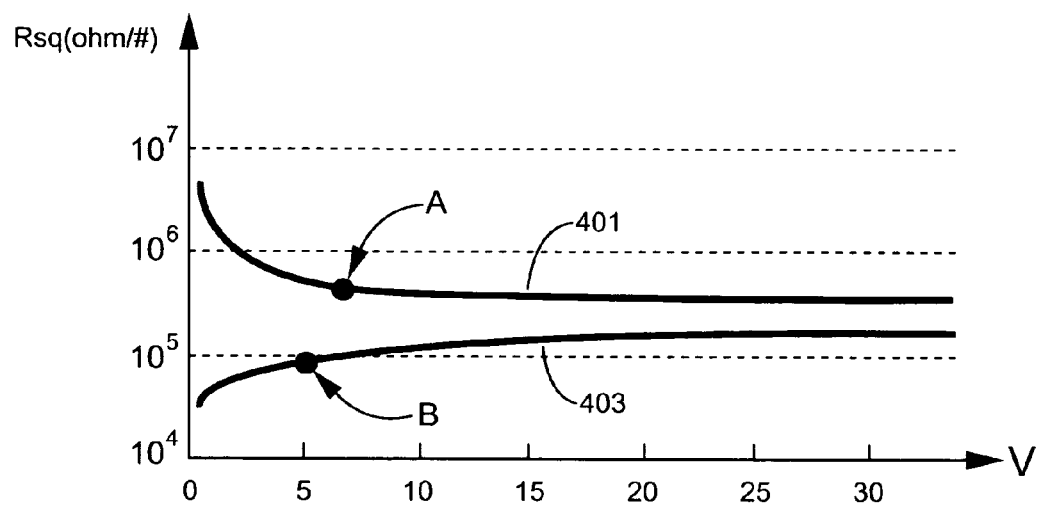
FIG. 4 illustrates two resistivity curves of two resistors manufactured by the present invention.

FIG. 4 illustrates the resistivity of two resistors manufactured by the present invention. The x axis represents voltages and the y axis represents ohms per unit. A curve 401 represents resistivity of a resistor formed by two split deep wells. Positions around point A indicate where the punch-through substantially occurs. The corresponding voltage values indicate the required voltage values that punch-through occurs. After punch-through, the curve is almost flat, which means the resistivity of the resistor is stable.

A curve 403 illustrates the resistivity of a resistor formed by two quasi-linked deep wells. Positions around point B indicate where the pinch-off substantially occurs. The corresponding voltage values indicate the required voltage values that pinch-off occurs. Similarly, the curve is almost flat after pinch-off.

It is worth to mention that resistivities of both resistors are greater than 100K ohms in this embodiment. The value is much greater than resistivities of resistors of the prior art. The voltage correlation coefficient to make punch-through or pinch-off is small, which is easily to be achieved. The aforementioned curves are for the purpose of an example and not intended to be a limitation of the present invention.

It is worth to mention that depending on geometries and ion concentrations of N+ regions and deep N-wells, differential voltage that causes punch-through may be greater than, be equivalent to, or be smaller than differential voltage that causes pinch-off.

Figure 5:
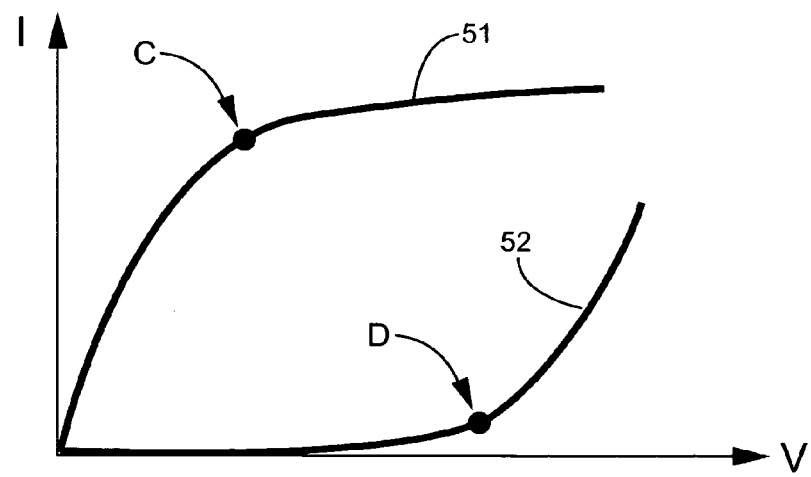
FIG. 5 illustrates two curves of current versus voltage of two resistors of the present invention.

FIG. 5 illustrates current versus voltage of two resistors manufactured by the present invention. The curve 51 represents a resistor with two quasi-linked deep wells. Point C represents the point where pinch-off substantially occurs. After pinch-off, the resistivity of the resistor dramatically increases, and the current increases very slowly once the voltage continuously increases. Similarly, point D of curve 52 represents where the punch-through substantially occurs. After point D, the resistivity of the resistor dramatically decreases and the current increases very fast once the voltage continuously increases. Similarly, differential voltage that causes punch-through may be greater than, be equivalent to, or be smaller than differential voltage that causes pinch-off.

According to the above description, the present invention is capable to provide semiconductor structures and voltage-controlled resistors with high resistivities. The corresponding semiconductor processes are also provided. Resistors generated by the present invention can be controlled by applying differential voltage. The present invention can achieve the goal by standard manufacturing processes without extra processes and costs.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor structure comprising:
a substrate being doped with a first type of ions;
a first doped well with a second type of ions, and formed in the substrate;
a second doped well with the second type of ions, the first type of ions and the second type of ions being complementary, and the second doped well formed in the substrate; and
a first depletion region and a second depletion region respectively formed by the first doped well and the substrate and the second doped well and the substrate, the first depletion region and the second depletion region being formed connected to each other,
wherein the semiconductor structure is characterized in that the first doped well and the second doped well are jointly adapted to perform a voltage-controlled resistivity; the resistivity of the resistor relates to a first depth of the first doped well, a second depth of the second doped well, and a distance between the first doped well and the second doped well; the distance between the first doped well and the second doped well is configured according to a first ion concentration of the first doped well, a second ion concentration of the second doped well, and a third ion concentration of the substrate; the resistivity is higher than that of a well resistor formed in a single doped well with the second type of ions; the first doped well and the second doped well are formed with a tapered shape and quasi-linked by partially overlapping; and connection between the first and second doped wells is interrupted when a differential voltage applied on the first doped well and the second doped well increases.

* * * * *